United States Patent
Sumita

(10) Patent No.: US 8,828,806 B2
(45) Date of Patent: Sep. 9, 2014

(54) DAM COMPOSITION FOR USE WITH MULTILAYER SEMICONDUCTOR PACKAGE UNDERFILL MATERIAL, AND FABRICATION OF MULTILAYER SEMICONDUCTOR PACKAGE USING THE SAME

(75) Inventor: Kazuaki Sumita, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 724 days.

(21) Appl. No.: 12/789,996

(22) Filed: May 28, 2010

(65) Prior Publication Data
US 2010/0304536 A1    Dec. 2, 2010

(30) Foreign Application Priority Data
Jun. 1, 2009 (JP) .................................. 2009-132009

(51) Int. Cl.

| | | |
|---|---|---|
| H01L 21/00 | (2006.01) | |
| C08G 59/50 | (2006.01) | |
| C08K 3/00 | (2006.01) | |
| C08L 63/00 | (2006.01) | |
| H01L 23/29 | (2006.01) | |
| H01L 21/56 | (2006.01) | |
| C08K 9/06 | (2006.01) | |
| C08K 5/00 | (2006.01) | |
| C08K 5/1515 | (2006.01) | |
| C08K 5/5435 | (2006.01) | |

(52) U.S. Cl.
CPC ..... *H01L 21/563* (2013.01); *H01L 2924/01012* (2013.01); *C08G 59/5033* (2013.01); *H01L 2224/73204* (2013.01); *H01L 2224/32145* (2013.01); *C08K 9/06* (2013.01); *C08K 3/0033* (2013.01); *C08K 5/0025* (2013.01); *C08K 5/1515* (2013.01); *H01L 2224/73203* (2013.01); *C08K 5/5435* (2013.01); *H01L 2924/01019* (2013.01); *C08L 63/00* (2013.01); *H01L 2924/10253* (2013.01); *H01L 23/295* (2013.01); *H01L 2224/16145* (2013.01); *H01L 2224/26175* (2013.01); *H01L 2924/12044* (2013.01)
USPC .................... 438/127; 257/778; 257/E23.169

(58) Field of Classification Search
USPC ............................ 438/127; 257/778, E23.169
See application file for complete search history.

(56) References Cited

U.S. PATENT DOCUMENTS

| | | | |
|---|---|---|---|
| 7,804,161 B2 | 9/2010 | Saeki | |
| 2001/0034382 A1* | 10/2001 | Sumita et al. ................. | 523/466 |

(Continued)

FOREIGN PATENT DOCUMENTS

| | | |
|---|---|---|
| EP | 0439171 A2 | 7/1991 |
| JP | 10-130470 A | 5/1998 |

(Continued)

OTHER PUBLICATIONS

Database WPI Week 200008 Thompson Scientific, London, GB, AN 2000-092647, XP002601991, Dec. 7, 1999.

(Continued)

*Primary Examiner* — Matthew Landau
*Assistant Examiner* — Igwe U Anya
(74) *Attorney, Agent, or Firm* — Birch, Stewart, Kolasch & Birch, LLP

(57) ABSTRACT

A composition comprising (A) an epoxy resin, (B) a curing agent, (C) an inorganic filler having an average particle size of 0.1-10 μm and a maximum particle size of up to 75 μm, and (D) a surface-silylated silica having an average particle size of 0.005 μm to less than 0.1 μm is suited as a dam composition for use with a underfill material in the fabrication of multilayer semiconductor packages.

9 Claims, 1 Drawing Sheet

(56) References Cited

U.S. PATENT DOCUMENTS

| | | | |
|---|---|---|---|
| 2003/0069349 A1* | 4/2003 | Sumita et al. | 524/588 |
| 2004/0192810 A1* | 9/2004 | Sumita et al. | 523/400 |
| 2006/0150527 A1* | 7/2006 | Ohara et al. | 51/308 |
| 2006/0214153 A1* | 9/2006 | Ikezawa et al. | 257/40 |
| 2006/0217499 A1* | 9/2006 | Takenaka | 525/533 |
| 2007/0196612 A1* | 8/2007 | Igarashi | 428/41.3 |
| 2008/0262158 A1* | 10/2008 | Morita et al. | 525/100 |
| 2008/0265438 A1* | 10/2008 | Asano | 257/778 |
| 2009/0184431 A1* | 7/2009 | Sumita et al. | 257/778 |
| 2009/0189277 A1* | 7/2009 | Apanius et al. | 257/729 |
| 2009/0236036 A1 | 9/2009 | Miyakawa et al. | |
| 2009/0253851 A1* | 10/2009 | Ohara et al. | 524/493 |
| 2010/0148387 A1* | 6/2010 | Komatsu et al. | 264/40.1 |
| 2010/0320581 A1 | 12/2010 | Saeki | |

FOREIGN PATENT DOCUMENTS

| | | | |
|---|---|---|---|
| JP | 10-158366 A | | 6/1998 |
| JP | 11-335443 A | | 12/1999 |
| JP | 2007-42904 A | | 2/2007 |
| JP | 2007-217708 A | | 8/2007 |
| JP | 2007-291407 A | | 11/2007 |
| JP | 2008-222961 A | | 9/2008 |
| JP | 2008-252026 A | | 10/2008 |
| JP | 2008-274083 A | | 11/2008 |
| JP | 2009-7467 A | | 1/2009 |
| JP | 2010109285 A | * | 5/2010 |
| WO | WO 2008/001695 A1 | | 1/2008 |

OTHER PUBLICATIONS

European Search Report dated Oct. 7, 2010 for Application No. 10005656.3.

Japanese Office Action dated Mar. 12, 2013 of Application No. 2010-122938.

* cited by examiner

DAM COMPOSITION FOR USE WITH MULTILAYER SEMICONDUCTOR PACKAGE UNDERFILL MATERIAL, AND FABRICATION OF MULTILAYER SEMICONDUCTOR PACKAGE USING THE SAME

CROSS-REFERENCE TO RELATED APPLICATION

This non-provisional application claims priority under 35 U.S.C. §119(a) on patent application No. 2009-132009 filed in Japan on Jun. 1, 2009, the entire contents of which are hereby incorporated by reference.

TECHNICAL FIELD

This invention relates to a dam composition for use in packaging a semiconductor chip assembly of multilayer structure prepared by flip chip (FC) bonding or through-silicon-via (TSV) connection, the dam helping an underfill material infiltrate thoroughly between chips under a capillary phenomenon; and a method for fabricating a multilayer semiconductor package using the dam composition. More particularly, it relates to a dam composition comprising two different inorganic fillers, which composition can be applied and molded at a high aspect ratio onto a circuit board so that when a semiconductor chip assembly having at least three layers stacked is sealed with an underfill material, the dam composition may help the underfill material infiltrate thoroughly between chips of the semiconductor chip assembly without spreading out of the board, and which composition cures into a tough product which is fully bondable to the underfill material.

BACKGROUND ART

The trend toward smaller sizes, lighter weights and higher capabilities in electrical equipment requires to increase the packaging density of electronic parts on a printed circuit board. This invites a shift in the dominant semiconductor mounting process from pin insertion to surface mounting.

Of the surface mount systems, the flip-chip mounting is by gang bonding a semiconductor chip to a conductor pattern surface of a circuit board via a plurality of bumps. Packaging is completed by filling the gap between the organic board and the semiconductor chip and gaps between solder bumps with an underfill material and curing the underfill material. As one application of this mount system, it is disclosed in JP-A 2007-42904 that a semiconductor chip with face down is flip-chip mounted to a circuit board having multilayer interconnections formed therein (known as interposer).

A multilayer semiconductor package adopting the TSV structure has emerged as the joining technology that replaces the prior art wire bonding technology. Lead-free bumps have changed to copper bumps.

An underfill material is used in the multilayer semiconductor package. By means of a dispenser, the underfill material is dispensed so as to infiltrate between the circuit board and the semiconductor chip by a capillary phenomenon. As the semiconductor chip assembly becomes multilayered, fillets are exaggerated, particularly at the dispenser side. There may arise the problems that the underfill spreads out of the circuit board, and in the case of a semiconductor chip laminate of wire bonding type, the underfill infiltrates through pads.

To avoid these problems, the substrate is provided with a dam for preventing the underfill from spreading. Prior art dam materials are less adherent to the underfill. Stripping can occur at the interface between the dam material and the underfill material during solder reflow or thermal cycling. A further problem is that cracks form in the package to cause breakage to the semiconductor chip surrounding region.

CITATION LIST

Patent Document 1: JP-A 2007-42904

DISCLOSURE OF INVENTION

An object of the invention is to provide a dam composition for use in the packaging of a semiconductor chip assembly of multilayer structure prepared by FC bonding or TSV connection, which can be applied and molded at a high aspect ratio onto a circuit board, helps an underfill material infiltrate thoroughly between chips without spreading out of the circuit board, is fully adherent to the underfill material, and cures into a tough product. Another object is to provide a method for fabricating a multilayer semiconductor package using the dam composition.

The inventor has found that a dam composition comprising (A) an epoxy resin, (B) a curing agent, (C) an inorganic filler having an average particle size of 0.1 to 10 μm and a maximum particle size of up to 75 μm, and (D) a surface-silylated silica having an average particle size of 0.005 μm to less than 0.1 μm is suited for use with an underfill material in the fabrication of multilayer semiconductor packages. More particularly, when used with an underfill material in the sealing of a semiconductor chip assembly of multilayer structure prepared by FC bonding or TSV connection, the dam composition can be applied and molded at a high aspect ratio onto a circuit board, helps the underfill material infiltrate thoroughly between chips without spreading out of the circuit board, is fully adherent to the underfill material, and cures into a tough product. Using the dam composition, a multilayer semiconductor package can be effectively fabricated.

In one aspect, the invention provides a dam composition for use with a multilayer semiconductor package underfill material, comprising (A) 100 parts by weight of an epoxy resin, (B) 1 to 50 parts by weight of a curing agent, (C) 30 to 1,000 parts by weight of an inorganic filler having an average particle size of 0.1 to 10 μm and a maximum particle size of up to 75 μm, and (D) 1 to 20 parts by weight of a surface-silylated silica having an average particle size of 0.005 μm to less than 0.1 μm.

In a preferred embodiment, component (A) comprises at least one member selected from the group consisting of a bisphenol A epoxy resin, a bisphenol F epoxy resin, and epoxy resins of the following formulae:

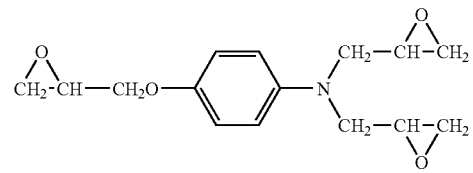

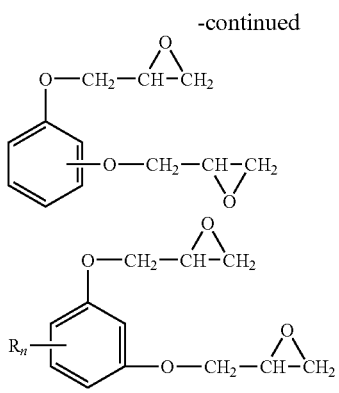

wherein R is a monovalent hydrocarbon group of 1 to 20 carbon atoms and n is an integer of 1 to 4. In another preferred embodiment, component (A) comprises a silicone-modified epoxy resin.

In a preferred embodiment, component (B) comprises at least one member selected from curing agents having formulae (1), (2), (3) and (4):

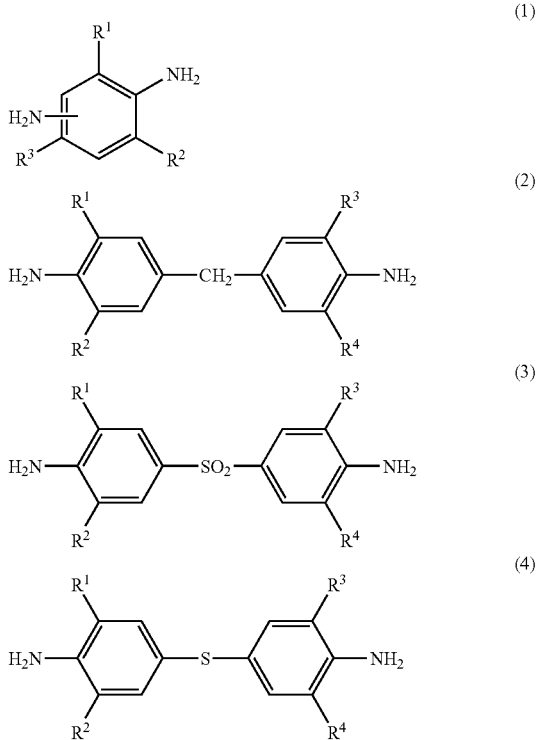

wherein $R^1$ to $R^4$ are each independently a monovalent hydrocarbon group of 1 to 6 carbon atoms, $CH_3S—$ or $C_2H_5S—$.

In a preferred embodiment, the inorganic filler (C) is spherical silica.

In another aspect, the invention provides a method for fabricating a multilayer semiconductor package comprising the steps of placing a multilayer semiconductor chip assembly on a circuit board, applying the dam composition defined above to mold a dam around the chip assembly on the circuit board, dispensing an underfill composition between the chip assembly and the dam so as to infiltrate between the circuit board and the chip assembly and between chips of the chip assembly, and curing both the dam composition and the underfill composition. Most often, the multilayer semiconductor package is a FC or TSV semiconductor package.

ADVANTAGEOUS EFFECTS OF INVENTION

When a semiconductor chip assembly of multilayer structure prepared by FC bonding or TSV connection is sealed with an underfill material, the dam composition can be applied and molded at a high aspect ratio onto the circuit board, helps the underfill material infiltrate thoroughly between chips without spreading out of the circuit board, is fully adherent to the underfill material, and cures into a robust product. Using the dam composition, a multilayer semiconductor package can be effectively fabricated.

DESCRIPTION OF EMBODIMENTS

Figure 1:
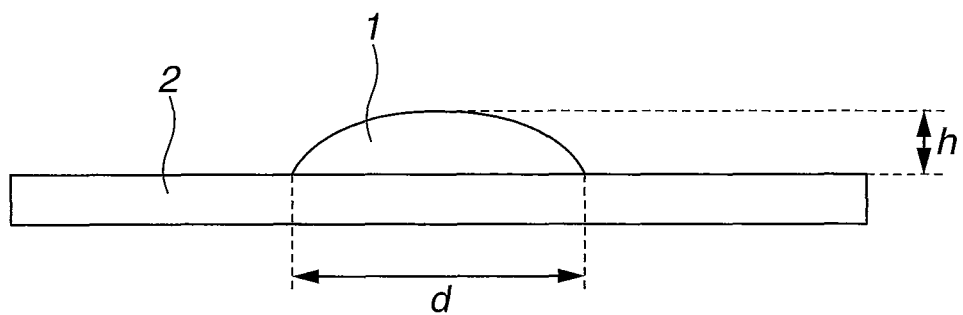
FIG. 1 is a schematic cross-sectional view illustrating the shape retaining ability of a dam composition.

The liquid epoxy resin composition of the invention comprises an epoxy resin, a curing agent, and two different inorganic fillers as essential components.

A. Epoxy Resin

Illustrative examples of the epoxy resin include bisphenol-type epoxy resins such as bisphenol A epoxy resin and bisphenol F epoxy resin, novolac-type epoxy resins such as phenol novolac epoxy resin and cresol novolac epoxy resin, naphthalene epoxy resins, biphenyl epoxy resins and cyclopentadiene epoxy resins. These epoxy resins may be used singly or in admixture of two or more. Of these, bisphenol A and bisphenol F epoxy resins are preferred.

Also preferred are epoxy resins of the following structures.

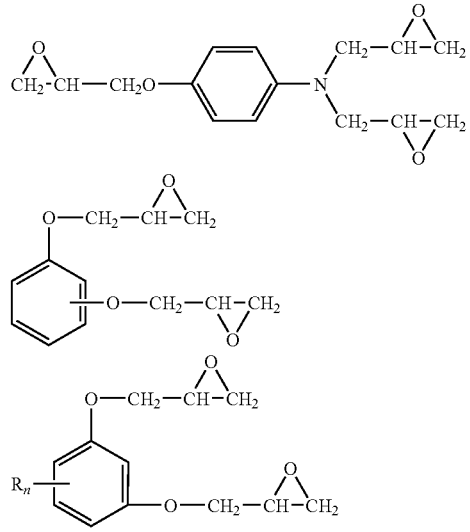

Herein R is a monovalent hydrocarbon group of 1 to 20 carbon atoms, preferably 1 to 10 carbon atoms, and more preferably 1 to 3 carbon atoms, examples of which include alkyl groups such as methyl, ethyl and propyl, and alkenyl groups such as vinyl and allyl. The subscript n is an integer of 1 to 4, especially 1 or 2.

When a specific epoxy resin of the above structure is used, its content is preferably 25 to 100%, more preferably 50 to 100%, and even more preferably 75 to 100% by weight of the overall epoxy resins. If the content of the specific epoxy resin is less than 25 wt %, the resulting composition may have an increased viscosity or cure into a product having poor heat resistance. The specific epoxy resin is commercially available under the trade name of MRGE from Nippon Kayaku Co., Ltd.

The epoxy resin used herein preferably comprises a silicone-modified epoxy resin. The silicone-modified epoxy resin is desirably a copolymer obtained by addition reaction of alkenyl groups on an alkenyl group-containing epoxy resin or an epoxy resin comprising an alkenyl group-containing phenolic resin with SiH groups on an organopolysiloxane. The organopolysiloxane has the average composition formula (5):

$$H_a R^5_b SiO_{(4-a-b)} \quad (5)$$

wherein $R^5$ is a substituted or unsubstituted monovalent hydrocarbon group, "a" is a number of 0.01 to 0.1, "b" is a number of 1.8 to 2.2, and $1.81 \leq a-b \leq 2.3$. In the organopolysiloxane, the number of silicon atoms per molecule is 20 to 400, and the number of silicon-bonded hydrogen atoms (or SiH groups) per molecule is 1 to 5, preferably 2 to 4, and most preferably 2.

The monovalent hydrocarbon groups represented by $R^5$ are preferably those of 1 to 10 carbon atoms, especially 1 to 8 carbon atoms, for example, alkyl groups such as methyl, ethyl, propyl, isopropyl, butyl, isobutyl, tert-butyl, hexyl, octyl and decyl; alkenyl groups such as vinyl, allyl, propenyl, butenyl and hexenyl; aryl groups such as phenyl, xylyl and tolyl; aralkyl groups such as benzyl, phenylethyl and phenylpropyl; and halogenated monovalent hydrocarbon groups in which some or all of the hydrogen atoms on the foregoing hydrocarbon groups are substituted by halogen atoms (e.g., chlorine, fluorine and bromine), such as chloromethyl, bromoethyl and trifluoropropyl.

Preferably the silicone-modified epoxy resin is of the structure having the following formula (6).

Herein $R^6$ is as defined for $R^5$, $R^7$ is $-CH_2CH_2CH_2-$, $-OCH_2-CH(OH)-CH_2-O-CH_2CH_2CH_2-$ or $-O-CH_2CH_2CH_2-$, $R^8$ is each independently hydrogen or an alkyl group of 1 to 4 carbon atoms, n is an integer of 4 to 199, preferably 19 to 109, p is an integer of 1 to 10, and q is an integer of 1 to 10.

The silicone-modified epoxy resin, when used, is preferably blended in such amounts that 1 to 20 parts by weight, more preferably 2 to 15 parts by weight of diorganosiloxane units are present relative to 100 parts by weight of the overall epoxy resins as component (A). Blending of the silicone-modified epoxy resin in the range is effective for reducing the stress of the cured product and improving the adhesion to the substrate. It is noted that the amount of diorganopolysiloxane is determined by the equation:

amount of diorganopolysiloxane=[(molecular weight of diorganopolysiloxane moiety)/(molecular weight of silicone-modified epoxy resin)]× (amount of silicone-modified epoxy resin blended).

B. Curing Agent

The curing agent (B) used herein for epoxy resins may be selected from amine, polymercaptan, imidazole, and dicyandiamide curing agents, with the amine curing agents being preferred. Acid anhydride curing agents may also be used if necessary.

The preferred amine curing agents are aromatic amine compounds having the general formulae (1) to (4).

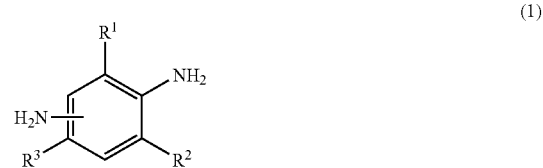

(1)

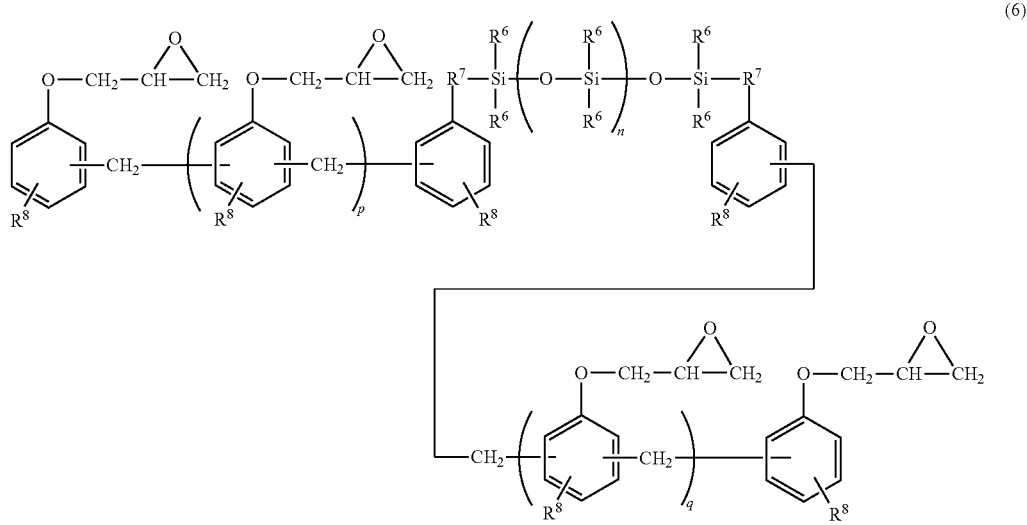

(6)

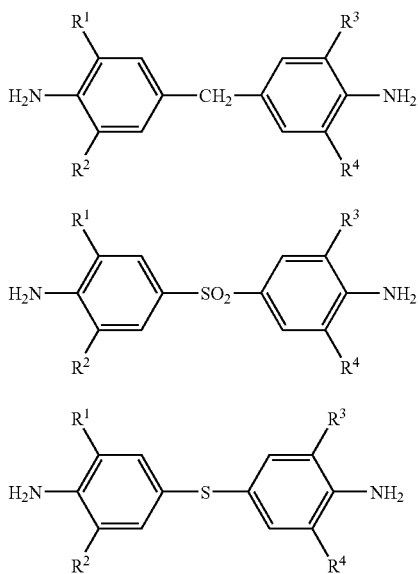

Herein $R^1$ to $R^4$ are each independently selected from a monovalent hydrocarbon group of 1 to 6 carbon atoms, $CH_3S-$ and $C_2H_5S-$.

The monovalent hydrocarbon groups represented by $R^1$ to $R^4$ are preferably those having 1 to 6 carbon atoms, more preferably 1 to 3 carbon atoms, for example, alkyl groups such as methyl, ethyl, propyl, isopropyl, butyl, isobutyl, tert-butyl and hexyl, alkenyl groups such as vinyl, allyl, propenyl, butenyl and hexenyl, phenyl groups, and halogenated monovalent hydrocarbon groups in which some or all of the hydrogen atoms are substituted by halogen atoms (e.g., chlorine, fluorine and bromine), such as fluoromethyl, bromoethyl and trifluoropropyl.

Notably aromatic amine compounds are generally solid at room temperature. If the aromatic amine curing agent is directly compounded with the epoxy resin, the resulting resin compound has an increased viscosity and is awkward to work. It is then preferred that the aromatic amine curing agent be melt mixed with the epoxy resin at such a temperature that the curing agent may not react with the epoxy resin. More preferably, the aromatic amine curing agent may be melt mixed with the epoxy resin in a predetermined proportion (described below) at a temperature in the range of 70 to 150° C. for 1 to 2 hours. At a mixing temperature below 70° C., the aromatic amine curing agent may be less miscible with the epoxy resin. A temperature above 150° C. can cause the aromatic amine curing agent to react with the epoxy resin to bring a viscosity buildup. A mixing time of less than 1 hour is insufficient to achieve intimate mixing of the aromatic amine curing agent with the resin, inviting a viscosity buildup. A time of more than 2 hours may allow the aromatic amine curing agent to react with the epoxy resin to bring a viscosity buildup as well.

The amount of the curing agent compounded is preferably 1 to 50 parts by weight of a polymercaptan or imidazole curing agent or 10 to 50 parts by weight of an amine curing agent, relative to 100 parts by weight of the epoxy resin (A). Outside the range, smaller amounts of the curing agent may result in undercure whereas larger amounts may detract from shelf stability.

C. Inorganic Filler Having an Average Particle Size of 0.1 to 10 μm and a Maximum Particle Size of Up to 75 μm The inorganic filler (C) may be selected from a variety of well-known inorganic fillers. Exemplary fillers include fused silica, crystalline silica, alumina, boron nitride, aluminum nitride, silicon nitride, magnesia, magnesium silicate, and aluminum. Among others, spherical fused silica is preferred for providing a composition with a low viscosity.

The inorganic filler used herein is preferably surface treated beforehand with a coupling agent such as a silane coupling agent or titanate coupling agent in order to increase the bond strength between the resin and the inorganic filler. The preferred coupling agents are silane coupling agents including epoxy silanes such as γ-glycidoxypropyltrimethoxysilane, γ-glycidoxypropylmethyldiethoxysilane, and β-(3,4-epoxycyclohexyl)ethyltrimethoxysilane, and amino silanes such as N-β-(aminoethyl)-γ-aminopropyltrimethoxysilane, γ-aminopropyltriethoxysilane, and N-phenyl-γ-aminopropyltrimethoxysilane. The amount of the coupling agent used for surface treatment and the method of surface treatment may be the same as will be described later for component (D).

The inorganic filler (C) should have an average particle size of 0.1 to 10 μm and a maximum particle size of up to 75 μm, and preferably an average particle size of 2 to 10 μm and a maximum particle size of up to 50 μm. At an average particle size of less than 0.1 μm, the composition loaded with such filler may have too high a viscosity, meaning that the loading of filler is limited. At an average particle size in excess of 10 μm or a maximum particle size in excess of 75 μm, voids may form in the cured composition. It is noted that the average particle size (also referred to as weight average particle size or median diameter $d_{50}$) and maximum particle size are determined by laser light diffraction analysis or the like.

The amount of inorganic filler (C) included in the composition is in a range of 30 to 1,000 parts, preferably 40 to 400 parts, and more preferably 50 to 300 parts by weight, per 100 parts by weight of the epoxy resin (A). A composition with less than 30 parts by weight of the filler may have too high a coefficient of expansion and induce cracks in the cured state. A composition with more than 1,000 parts by weight of the filler may have too high a viscosity.

D. Surface-Silylated Silica Having an Average Particle Size of 0.005 μm to Less than 0.1 μm Component (D) is a silylated silica, which cooperates with the inorganic filler (C) to provide the cured composition with a reduced coefficient of expansion and an increased modulus of elasticity.

Notably fillers having different particle size distribution are used as components (C) and (D). Silica as component (D) is surface silylated because the epoxy resin composition can be endowed with thixotropy by utilizing the cohesive force of hydrogen bond.

The surface-silylated silica should have an average particle size of 0.005 μm to less than 0.1 μm, preferably from 0.008 μm to 0.08 μm. At an average particle size of less than 0.005 μm, the composition loaded with such silica may have a high viscosity and become extremely awkward to work. An average particle size of more than 0.1 μm may allow the epoxy resin composition to contact chips on the board or spread over the edge of a heat sink. It is noted that the average particle size may be determined by dynamic light scattering, laser trap or analogous analysis.

The surface-silylated silica is commercially available as Aerosil 130, 200 and 300 (fumed silica) from Nippon Aerosil Co., Ltd. and Nipsil VN-3-LP (wet silica) from Nippon Silica Industry Co., Ltd.

The silylation treatment generally uses silylating agents such as $CH_3Si(OCH_3)_3$, $(CH_3)_3SiOCH_3$, $PhSi(OCH_3)_3$, $PhSiCH_3(OCH_3)_2$, $[(CH_3)_3Si]_2NH$, and $CH_3CH_2Si(OCH_3)_3$ wherein Ph stands for phenyl.

To obtain the silylated silica, silica may be previously treated with the silylating agent. An alternative is an integral blending method of adding and compounding the silylating agent during preparation of the dam composition. The former method is preferred because the amount of the silylating agent used is limited.

The amount of silylated silica (D) included in the composition is in a range of 1 to 20 parts, preferably 3 to 15 parts by weight, per 100 parts by weight of the epoxy resin (A). A composition with less than 1 part by weight of the silylated silica may be difficult to inhibit the underfill material from spreading out. An epoxy resin composition with more than 20 parts by weight of the silylated silica may have too high a viscosity, lose fluidity and substantially cease to be liquid.

Additives

In addition to components (A) to (D), silicone rubbers, silicone oils, liquid polybutadiene rubbers, and thermoplastic resins such as methyl methacrylate-butadiene-styrene copolymers may be included in the dam composition for the stress reduction purpose. Also cure promoters, silane coupling agents, pigments (e.g., carbon black), dyes, antioxidants, and other additives may be included as long as they do not compromise the objects of the invention.

Preparation

The dam composition may be prepared by the simultaneous or sequential agitation, dissolution, mixing and dispersion of components (A) to (D) and optional additives, while carrying out heat treatment if necessary. No particular limitation is imposed on the apparatus used for mixing, agitating, dispersing and otherwise processing the mixture of components. Exemplary apparatus suitable for this purpose include an automated mortar, three-roll mill, ball mill, and planetary mixer, coupled to agitator and heater units. Use can also be made of suitable combinations of these apparatuses.

The dam composition is desirably adjusted to a viscosity at 25° C. of 1 to 500 Pa-s, and more desirably 1 to 150 Pa-s. The viscosity is measured by Brookfield cone/plate viscometer.

Method for Fabricating Multilayer Semiconductor Package

Figure 2:
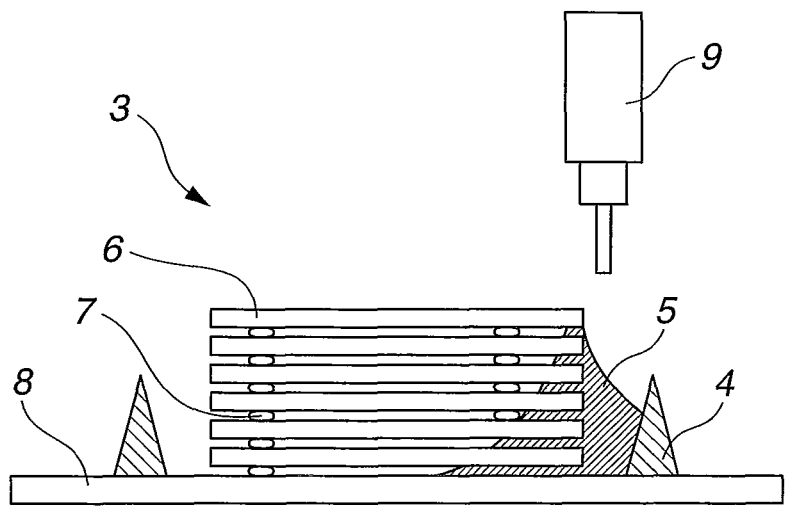
FIG. 2 is a schematic cross-sectional view illustrating one exemplary multilayer semiconductor package being fabricated.

A multilayer semiconductor package is fabricated as shown in FIG. 2. First a multilayer semiconductor chip assembly 6 (including six layers in FIG. 2) is placed on a circuit board 8. A dam composition is applied to mold a dam 4 around the chip assembly 6 on the circuit board 8. An underfill composition 5 from a dispenser 9 is dispensed between the chip assembly 6 and the dam 4 whereby the underfill composition infiltrates between the circuit board 8 and the chip assembly 6 and between chips (or layers) of the chip assembly 6. Finally both the dam composition and the underfill composition are cured.

The underfill composition used herein is, for example, a composition comprising an epoxy resin, an amine curing agent, and silica, having a viscosity of about 10 to 50 Pa-s at 25° C. The dispenser used for dispensing the underfill composition may be a precision fluid dispenser commercially available from Nordson Asymtek, for example.

Suitable conditions may be employed in curing the dam and underfill compositions. It is preferable to carry out an initial hot oven cure at 100 to 120° C. for at least 0.5 hour, followed by a subsequent hot oven cure at 150 to 175° C. for at least 2 hours. A cure time of less than 0.5 hour during 100-120° C. heating may result in void formation after curing. A post-cure time of less than 2 hours during 150-175° C. heating may yield a cured product having less than sufficient properties.

When the dam composition is applied to mold the dam 4 around the multilayer semiconductor chip assembly 6, the position and shape of the dam are not particularly limited. Preferably the dam is formed at a position spaced 50 μm to 5 mm, especially 100 μm to 2 mm, from the side edge of the chip assembly, and has a width of 10 μm to 1 mm, especially 50 μm to 0.8 mm, and a height of 50 μm to 2 mm, especially 100 μm to 1 mm. In applying and molding the dam composition, a precision fluid dispenser similar to the dispenser 9 for the underfill composition, for example, a jet dispenser from Nordson Asymtek may be used.

EXAMPLE

Examples of the invention and comparative examples are given below by way of illustration, and are not intended to limit the invention.

Examples 1-4 and Comparative Examples 1-2

The epoxy resin, curing agent, inorganic filler, silylated silica, and additives shown in Table 1 were intimately kneaded on a three-roll mill to form dam compositions. These dam compositions were evaluated by several tests. The results are also shown in Table 1.

The ingredients used and the tests are described below.

[Ingredients]

A. Epoxy Resin

Epoxy resin A1: bisphenol F epoxy resin, RE303S-L, Nippon Kayaku Co., Ltd.

Epoxy resin A2: trifunctional epoxy resin, Epikote 630H, Japan Epoxy Resin Co., Ltd.

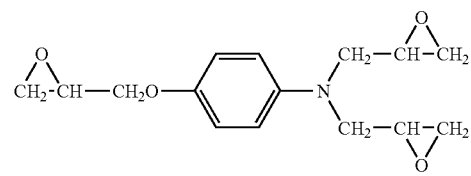

Epoxy resin A3: silicone-modified epoxy resin

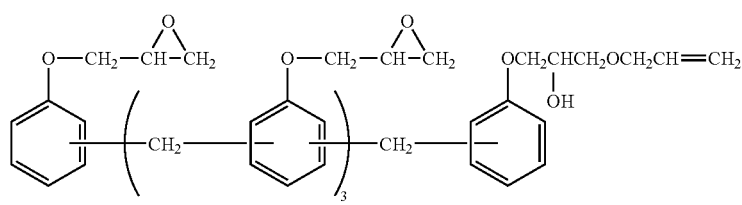

addition reaction product of the following:

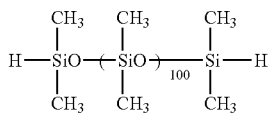

B. Curing Agent
  Curing agent B1: 3,3'-diethyl-4,4'-diaminodiphenyl-methane, Kayahard AA, Nippon Kayaku Co., Ltd.
  Curing agent B2: 3,3',5,5'-tetraethyl-4,4'-diaminodiphenylmethane, C-300S, Nippon Kayaku Co., Ltd.
C. Inorganic Filler
  Silica C: spherical silica having an average particle size of 7 μm and a maximum particle size of up to 53 μm, Tatsumori K. K.
D. Surface-Silylated Silica
  Silica D1: silica treated with $[(CH_3)_3Si]_2NH$ and $CH_3CH_2Si(OCH_3)_3$ having an average particle size ($d_{50}$) of 0.008 μm
  Silica D2: silica treated with $[(C_3)_3Si]_2NH$ and $CH_3CH_2Si(OCH_3)_3$ having an average particle size ($d_{50}$) of 0.01 μm
  Silica D3: silica treated with $[(CH_3)_3Si]_2NH$ and $CH_3CH_2Si(OCH_3)_3$ having an average particle size ($d_{50}$) of 0.08 μm
  Silica D4: silica treated with $[(CH_3)_3Si]_2NH$ and $CH_3CH_2Si(OCH_3)_3$ having an average particle size ($d_{50}$) of 0.12 μm
E. Additives
  Silane coupling agent:
    γ-glycidoxypropyltrimethoxysilane, KBM403, Shin-Etsu Chemical Co., Ltd.
  Reactive diluent: phenyl glycidyl ether, PGE, Nippon Kayaku Co., Ltd.

[Tests]

Aspect Ratio of Cured Part

Provided that a cured part has a height (h) and a diameter (d), an aspect ratio (h/d) is an index indicative of the shape retaining ability of the dam composition. Specifically, the aspect ratio was determined as shown in FIG. 1 by dispensing 0.1 g of a dam composition 1 on a glass plate 2 of 1 mm thick, holding for 5 minutes, and transferring the glass plate 2 onto a hot plate (not shown) preheated at 120° C. After the dam composition cured, the cured part 1 was cooled. The height (h) and diameter (d) of the cured part 1 were measured, from which an aspect ratio (h/d) was computed. It is noted that the glass plate 2 had been cleaned with acetone to provide a consistent surface state.

Flexural Modulus

The dam composition was heat cured at 150° C. for 3 hours to form a sample of 10 mm by 100 mm by 4 mm, which was measured for flexural modulus according to JIS K-7161.

Tg, CTE-1 and CTE-2

The dam composition was heat cured at 150° C. for 3 hours. The cured part was cooled to room temperature and cut into a sample of 5 mm by 5 mm by 15 mm. While the sample was heated on a thermomechanical analyzer at a ramp of 5° C./min, the glass transition temperature (Tg) was measured. Based on the Tg measurement, a coefficient of thermal expansion below Tg (CTE-1) was determined for a temperature range of 20 to 50° C., and a coefficient of thermal expansion above Tg (CTE-2) was determined for a temperature range of 200 to 230° C.

Spread-Out of Underfill

A multilayer semiconductor package was fabricated as follows while it was examined whether or not the underfill material spread out.

(i) Fabrication of Multilayer Semiconductor Package

A multilayer (6-layer) semiconductor chip assembly 6 was prepared by combining six silicon chips of 10 mm by 10 mm by 0.25 mm and spherical resin bead spacers having a diameter of 20 μm. As shown in FIG. 2, the chip assembly 6 was placed on a bismaleimide triazine resin (BT) substrate 8 having the size of 40 mm×40 mm×1.0 mm. A dam composition was applied to the substrate 8 around the chip assembly 6 to mold a dam 4 having a width of 0.3 mm and a height of 0.3 mm at a position spaced 1 mm from each side of the chip assembly 6. An underfill composition 5 from the dispenser 9 was dispensed between the chip assembly 6 and the dam 4 whereby the underfill composition infiltrated between the chips (or layers) of the chip assembly. The dam and underfill compositions 4 and 5 were heat cured at 165° C. for 2 hours, completing a multilayer semiconductor package 3.

The underfill composition used herein was a composition comprising an epoxy resin, an amine curing agent, and silica, having a viscosity of 10 Pa·s at 25° C.

(ii) Evaluation of Spread-Out

In the process of fabricating the multilayer semiconductor package, it was examined whether or not the underfill material spread out.

Bond Strength

A sample was prepared as follows, and the bond strength between underfill and dam was measured before and after a thermal shock test.

(i) Preparation of Sample

A dam composition was applied onto a BT substrate to a thickness of about 0.5 mm. An underfill composition was applied thereon to mold a frust-conical part having a bottom diameter of 5 mm, a top diameter of 2 mm and a height of 6.2 mm while a hook was anchored at the center of its top. By heat curing at 165° C. for 2 hours, a sample was completed.

(ii) Evaluation of Bond Strength

The sample was subjected to a thermal shock test between −55° C. and 125° C. over 1,000 cycles according to JIS C-0025. The bond strength of the sample was measured before (initial) and after the thermal shock test by securing the BT substrate of the sample to a platform, engaging a hook of a push pull gauge with the hook on top of the molded part, and determining a shear bond strength.

TABLE 1

| | Amount (pbw) | Example | | | | Comparative Example | |
|---|---|---|---|---|---|---|---|
| | | 1 | 2 | 3 | 4 | 1 | 2 |
| Epoxy resin | A1 (RE303SL) | 32 | 32 | 32 | 32 | 32 | 32 |
| | A2 (Epikote 630H) | 32 | 32 | 32 | 32 | 32 | 32 |
| | A3 (Silicone-modified epoxy resin) | 4 | | | | 4 | |

TABLE 1-continued

|  | Amount (pbw) | Example 1 | Example 2 | Example 3 | Example 4 | Comparative Example 1 | Comparative Example 2 |
|---|---|---|---|---|---|---|---|
| Curing agent | B1 (Kayahard AA) | 17 | 17 | 17 | 17 | 17 | 17 |
|  | B2 (C-300S) | 17 | 17 | 17 | 17 | 17 | 17 |
| Inorganic filler | Silica C | 150 | 150 | 150 | 150 | 150 | 1100 |
| Silylated silica | Silica D1 (0.008 µm) | 10 | 10 |  |  |  | 5 |
|  | Silica D2 (0.01 µm) |  |  | 10 |  |  |  |
|  | Silica D3 (0.08 µm) |  |  |  | 10 |  |  |
|  | Silica D4 (0.12 µm) |  |  |  |  | 10 |  |
| Additive | Reactive diluent PGE | 3 | 3 | 3 | 3 | 3 |  |
|  | Silane KBM403 | 1 | 1 | 1 | 1 | 1 |  |
| Test results | Aspect ratio (h/d) of cured part | 0.58 | 0.55 | 0.56 | 0.59 | 0.15 | too high a viscosity to mold |
|  | Flexural modulus (MPa) | 5670 | 5780 | 5720 | 5700 | 5650 |  |
|  | Tg (° C.) | 108 | 108 | 108 | 108 | 109 |  |
|  | CTE-1 (ppm/° C.) | 38 | 37 | 37 | 37 | 38 |  |
|  | CTE-2 (ppm/° C.) | 120 | 115 | 113 | 118 | 119 |  |
|  | Spread-out of underfill | Nil | Nil | Nil | Nil | Spread |  |
|  | Initial bond strength (MPa) | 7.3 | 5.9 | 6.2 | 6.4 | 7.2 |  |
|  | Bond strength after 1000 cycles (MPa) | 6.8 | 5.7 | 6.3 | 6 | 6.3 |  |

The dam compositions of Examples 1 to 4 are able to retain their shape as demonstrated by a high aspect ratio of cured parts, and when used in the fabrication of multilayer semiconductor packages, help the underfill composition smoothly infiltrate between chips without spreading out of the substrate. The samples maintain a high bond strength before and after the thermal shock test.

In contrast, the dam composition of Comparative Example 2 has too high a viscosity to apply or mold. The dam composition of Comparative Example 1 maintains a high bond strength before and after the thermal shock test, but is poor in retaining its shape as demonstrated by a low aspect ratio of cured part, and when used in the fabrication of multilayer semiconductor packages, undesirably allows the underfill composition to spread out of the substrate.

Japanese Patent Application No. 2009-132009 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for fabricating a multilayer semiconductor package comprising the steps of:
   placing a multilayer semiconductor chip assembly on a circuit board,
   applying a dam composition to mold a dam around the chip assembly on the circuit board,
   dispensing an underfill composition between the chip assembly and the dam so as to infiltrate between the circuit board and the chip assembly and between chips of the chip assembly, and
   curing both the dam composition and the underfill composition,
      wherein said multilayer semiconductor package is a flip chip or through-silicon-via semiconductor package, and
      wherein
   said dam composition comprises (A) 100 parts by weight of an epoxy resin, (B) 1 to 50 parts by weight of a curing agent, (C) 30 to 1,000 parts by weight of an inorganic filler having an average particle size of 0.1 to 10 µm and a maximum particle size of up to 75µm, and (D) 1 to 20 parts by weight of a surface-silylated silica having an average particle size of 0.005 µm to less than 0.1 µm,
   said underfill composition comprises an epoxy resin, an amine curing agent, and silica, and has a viscosity of 10 to 50 Pa-s at 25° C.,
   said dam composition and said underfill composition are cured in conditions of: an initial hot oven cure at 100 to 120° C. for at least 0.5 hour; followed by a subsequent hot oven cure at 150 to 175° C. for at least 2 hours,
   an initial bond strength between the cured products of the dam composition and the underfill composition is 5.9 to 7.3 MPa,
   a bond strength between the cured products of the dam composition and the underfill composition after a thermal test over 1000 cycles between −55° C. and 125° C. is 5.7 to 6.8 MPa, and
   said bond strength after said thermal test is no more than 0.5 MPa lower than said initial bond strength value.

2. The method of claim 1 wherein the inorganic filler (C) of the dam composition is spherical silica.

3. The method of claim 1 wherein component (A) of the dam composition comprises at least one member selected from the group consisting of a bisphenol A epoxy resin, a bisphenol F epoxy resin, and epoxy resins of the following formulae:

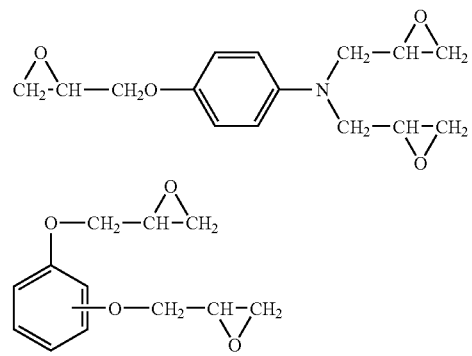

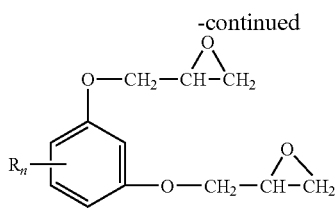

wherein R is a monovalent hydrocarbon group of 1 to 20 carbon atoms and n is an integer of 1 to 4.

4. The method of claim 1 wherein component (A) of the dam composition comprises a silicone-modified epoxy resin.

5. The method of claim 1 wherein component (B) of the dam composition comprises at least one member selected from curing agents having formulae (1), (2), (3) and (4):

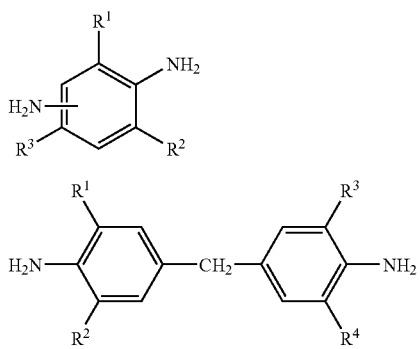

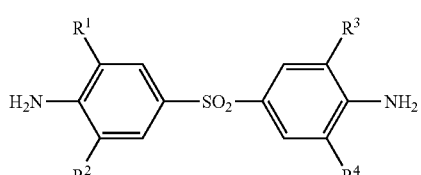

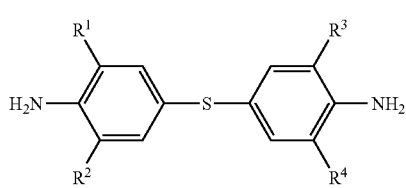

wherein $R^1$ to $R^4$ are each independently a monovalent hydrocarbon group of 1 to 6 carbon atoms, $CH_3S-$ or $C_2H_5S-$.

6. The method of claim 1 wherein the dam composition has a viscosity of 1 to 500 Pa-s at 25° C.

7. The method of claim 1 wherein the average particle size of the surface-silylated silica is 0.008 μm to 0.08 μm.

8. The method of claim 1 wherein the surface-silylated silica is silylated by a silylating agent selected from the group consisting of $CH_3Si(OCH_3)_3$, $(CH_3)_3SiOCH_3$, $PhSi(OCH_3)_3$, $PhSiCH_3(OCH_3)_2$, $[(CH_3)_3Si]_2NH$ and $CH_3CH_2Si(OCH_3)_3$, wherein Ph stands for phenyl.

9. The method of claim 1 wherein the amount of component (D) is in a range of 3 to 15 parts by weight per 100 parts by weight of the epoxy resin (A).

* * * * *